(12) United States Patent  
Yira et al.

(10) Patent No.: US 6,326,056 B1  
(45) Date of Patent: Dec. 4, 2001

(54) MOBILE CELLULAR TUMBLE COATING METHOD

(75) Inventors: Joseph H. Yira, Amery; Mark Neitzke, New Richmond; Craig K Mattison, Boyceville, all of WI (US)

(73) Assignee: Specialty Coating Systems, Inc., Clear Lake, WI (US)

( * ) Notice: Subject to any disclaimer, the term of this patent is extended or adjusted under 35 U.S.C. 154(b) by 0 days.

(21) Appl. No.: 09/505,267

(22) Filed: Feb. 16, 2000

(51) Int. Cl.$^7$ ................................................ C23C 16/00
(52) U.S. Cl. ...................... 427/248.1; 427/294; 427/299
(58) Field of Search ............................... 427/248.1, 294, 427/299

(56) References Cited

U.S. PATENT DOCUMENTS

| | | | |
|---|---|---|---|
| 4,758,288 | 7/1988 | Versic | 149/6 |
| 5,201,956 | 4/1993 | Humphrey et al. | 118/716 |
| 5,534,067 | 7/1996 | Fulker et al. | 118/681 |

Primary Examiner—Bernard Pianalto (74) Attorney, Agent, or Firm—Mintz, Levin, Cohn, Ferris, Glovsky and Popeo, P.C.

(57) ABSTRACT

A mobile cellular tumble coater and method is provided to coat articles with materials suitable for coating by vapor deposition under vacuum conditions. The mobile cellular tumble coater comprises multiple mobile part cells disposed on a hollow cylindrical chamber of an inner support base positioned within a coating chamber of a coating apparatus. Each mobile part cell comprises a hollow portion with an outer wall having multiple throughholes large enough to permit vapors of coating material to flow into the mobile part cell and small enough to contain the articles therein. In an embodiment of invention, the mobile part cells are removably attached to the inner support base by rigid cables in such a manner that enables the mobile part cells to swing from the inner support base. As the inner support base rotates during the coating process, the mobile part cells attached thereon are propelled away from the inner support base until downward rotation causes the mobile part cells to collide with the inner support base. Such collision produced mechanical agitation causes the articles contained within the mobile part cells to remain in a sufficiently mobile state during the coating process such that the articles do not stick together or become coated together.

1 Claim, 4 Drawing Sheets

MOBILE CELLULAR TUMBLE COATING METHOD

FIELD OF THE INVENTION

The present invention relates to an apparatus and method for coating articles with polymers and other materials suitable for coating by vapor deposition. More specifically, the present invention provides an apparatus and method for coating wires and wire-type parts with the polymer parylene by a vapor deposition coating process conducted in a coating apparatus.

BACKGROUND OF THE INVENTION

Prior art methods of coating articles with polymers include the process of vapor deposition. Parylene is an excellent polymer for coating articles due to its ability to form thin surface films and to conform to articles of various shapes and surface configurations. Parylene is particularly suited for coating wires and wire-type parts of various lengths and diameters due to such coating properties. Parylene is typically applied to the surfaces of articles by the process of vapor deposition conducted under vacuum conditions in a coating apparatus. The parylene dimer is first vaporized to a gaseous state and then pyrolitically cleaved to form reactive monomer parylene vapors. The monomer parylene vapors are transferred to and circulate within a coating chamber of the coating apparatus in which articles to be coated are contained. As the monomer vapors contact the surfaces of the articles, the vapors condense on the surfaces and polymerize to form a surface film or coating of parylene on the articles. Such a deposition coating process is an excellent method of coating wire-type articles and wire parts on which even surface films or coatings are difficult to achieve. This is particularly the case when coating when coating large quantities or bulk loads of wire-type articles and wire parts by a vapor deposition process.

Prior art devices for coating articles by vapor deposition include a drum-type apparatus, as disclosed in U.S. Pat. No. 4,758,288, wherein articles are placed in a coating drum which rotates and tumbles articles during the coating process. A disadvantage of this coating apparatus is that parylene vapors must be introduced into the drum by means of a feed tube. As the vapor deposition coating process is conducted under vacuum conditions, pressure gradients may be created within the drum and also between the drum and the external atmosphere in which parylene vapors circulate. Pressure gradients cause an uneven circulation of parylene vapors which results in uneven depositing of parylene vapors on the surfaces of articles and uneven and inconsistent surface films. In addition, the coating apparatus is not conducive to coating large quantities or bulk loads of articles due to mechanical damage to surface films cause by the weight of large quantities or bulk loads.

The basket-type cellular apparatus disclosed in U.S. Pat. No. 5,201,956, assigned to the assignee of the present application, is an improvement upon the drum-type apparatus, wherein a plurality of basket-type cells with multiple side wall throughholes are configured about a common axis of rotation. The side wall throughholes put articles contained therein in close communication with circulating parylene vapors as the basket-type cells are rotated during the coating process. Although an improvement over prior art devices, the basket-type cellular apparatus is not by itself always a suitable means for coating large quantities or bulk loads of articles, particularly large or bulk loads of wire-type articles and wire parts.

Other prior art devices for coating wire-type articles and wire parts by parylene vapor deposition include manually mounting individual articles in a static position to a fixture plate contained within a coating chamber of a coating apparatus. For example, mounting wire parts to the fixture plate enables individual wire parts to hang freely, exposing the surfaces of the wire parts to parylene vapors which circulate in the atmosphere within the coating chamber. However, the wire parts must be sufficiently spaced apart to prevent adjacent wire parts from touching or adhering together. Insufficient space between individual wire parts can cause an uneven deposition of parylene which forms inconsistent surface films on the wire parts or results in portions of the surfaces of the wire parts to remain uncoated. The spatial arrangement required insure thorough and even parylene deposition and ultimately even and consistent surface films or coatings involves significant manual handling and fixturing to appropriately space and mount individual wire parts to the fixture plate. Manually mounting and removing individual wire parts in this manner is a labor intensive practice which reduces the efficiency of this coating process.

As a result, the use of a device such as the fixture plate to properly arrange wire parts for deposition coating results in a low parts per load ratio. This coating process is also a static method of coating, wherein the wire parts remain stationary during the coating process. Such a static process, therefore, is highly dependent upon achieving an adequate circulation of parylene vapors and susceptible to pressure gradients which may occur in the atmosphere of the coating apparatus.

Therefore, it is desirable to have a vapor deposition coating apparatus and method which reduces or eliminates the need for manual handling and fixturing of articles, and which increases the parts per load ratio of prior art devices, particularly with respect to coating wire-type articles and wire parts. In addition, it is also desirable to reduce the susceptibility of the coating apparatus and method to pressure gradients during the coating process by adequately exposing the surfaces of the articles to be coated, while preventing the articles from sticking or becoming coated together. In addition, it is desirable to provide a vapor deposition coating apparatus and method for surface coating large quantities or bulk loads of articles, and particularly large quantities or bulk loads of wire-type articles and wire parts, which produces even and consistent surface films.

SUMMARY OF THE INVENTION

Embodiments of the present invention provide an apparatus and method for coating articles and, in particular, for coating large quantities or bulk loads of articles, including wire-type articles and wire parts, by a process of vapor deposition which overcomes the problems of prior art devices and methods described above.

In a first embodiment of the present invention, a mobile cellular tumble coater is provided for coating wire parts by a process of vapor deposition conducted under vacuum conditions within a coating apparatus. The mobile cellular tumble coater is positioned within a coating chamber of the coating apparatus, wherein parylene vapors are circulated to coat wire parts contained in the mobile cellular tumble coater. Parylene vapors circulate through the atmosphere of the coating chamber and the mobile cellular tumble coater and, upon contact with surfaces of wire parts, condense and polymerize on surfaces of wire parts to produce parylene surface coats. During the vapor deposition process, the mobile cellular tumble coater rotates and tumbles causing wire parts contained therein to be maintained in a sufficiently mobile state during the coating process such that wire parts are prevented from sticking together or becoming coated together by parylene deposition.

In a first embodiment of the present invention, the mobile cellular tumble coater includes at least one mobile part cell and an inner support base to which the mobile part cell is disposed. The mobile part cell includes a hollow portion with a first terminal end and a second terminal end and an outer wall connecting each terminal end. The hollow portion of the mobile part cell may be constructed as a circular cylinder. The outer wall of the hollow portion has multiple throughholes which are large enough to allow vapors of coating material to flow into the mobile part cell, yet small enough to contain wire parts to be coated. The hollow portion may be constructed of metal screening or other suitable materials which have the properties to withstand the conditions of the vapor deposition coating process, such as, but not limited to, wire mesh, high-density polyethylene, polyvinylchloride, polyurethane and nylon. The gauge of the screening may be increased or decreased to accommodate the size of wire parts to be coated.

At least one of the terminal ends of the hollow portion of the mobile part cell includes an end cap that is removably attached to the mobile part cell and permits loading and unloading of wire parts. The end cap may be constructed for complete removal from the mobile part cell or may be attached to the mobile part cell by hinges. The end cap is constructed of high-density polyethylene or other suitable materials which have the properties to withstand the conditions of the vapor deposition coating process, such as, but not limited to, polyvinylchloride, polyurethane and nylon.

The inner support base of the mobile cellular tumble coater includes a hollow cylindrical chamber with a larger overall dimension than the mobile part cell to which the mobile part cell is disposed. The hollow chamber may be constructed and arranged as a circular cylinder similar to the mobile part cell and constructed of porous or solid material suitable to withstand the conditions of the vapor deposition process. Alternatively, the hollow chamber may comprise multiple throughholes large enough to permit the flow of vapors of coating material through the hollow chamber to enhance circulation of vapors throughout the coating chamber and the mobile part cell.

The mobile cellular tumble coater further includes a mechanism to rotate the inner support base and the mobile part cell disposed thereon. The mechanism may include a drive motor and drive shaft which is rigidly connected at a first terminal end to the inner support base and passes through the coating chamber and a vacuum seal to connect to the drive motor at an opposite terminal end. The drive motor turns the drive shaft which causes the inner support base to rotate within the coating chamber.

In the first embodiment of the present invention, the mobile part cell is removably attached to an outer surface of the inner support base by at least two attachment devices, such as, but not limited to, a pair of cables. A first terminal end of each cable is connected adjacent to the first or the second terminal end of the mobile part cell. A second terminal end of each cable is attached to the outer surface of the inner support base in such a manner that the cable permits the mobile part cell to move and swing away from the inner support base. Each cable may be attached to the inner support base by a loop or hook-like connection that permits the cable to move and swing from its point of attachment to the inner support base, thereby swinging or propelling the mobile part cell away from the inner support base.

The cables and other similar attachment devices permit easy detachment and reattachment of the mobile part cell from the inner support base for loading articles into the mobile part cell. Other attachment devices may include, but are not limited to, hinges, wires and rods. The attachment devices are constructed of rigid, inflexible material which has the properties to withstand the conditions of the vapor deposition process.

When attached to the inner support base, the mobile part cell rotates from a fixed position on the inner support base as the inner support base is rotated by the drive shaft. The rigid and inflexible nature of the cables permits the mobile part cell to swing or be propelled away from the inner support base. The loop or hook-line connection which attaches each cable to the inner support base facilitates such movement of the mobile part cell away from the inner support base. Without a rigid and inflexible nature, the cables would buckle and collapse under the weight of the mobile part cell and cause the mobile part cell to roll and slide on the inner support base in a relaxed position, rather than swing or be propelled away from the inner support base.

The deposition coating process begins with the vaporization and pyrolization of parylene. Although more stable as a dimer, parylene must be initially vaporized and then pyrolytically cleaved into monomer vapors prior to circulating throughout the coating chamber of the coating apparatus. Parylene is pyrolized to monomer vapors by the process disclosed in U.S. Pat. No. 5,201,956, which is assigned to the assignee of the present application and incorporated herein by reference.

Monomer parylene vapors are transferred to the coating chamber of the coating apparatus in which the mobile cellular tumble coater is positioned and circulate throughout the atmosphere of the coating chamber and the mobile cellular tumble coater. In the first embodiment, the rotation of the inner support base causes the mobile part cell attached thereon to rotate from a fixed position on the inner support base. As the inner support base rotates, the mobile part cell swings from or is propelled away from the inner support base. The mobile part cell rotates upward in a circular arc until reaching just past a top or uppermost point of the circular arc, wherein the mobile part cell begins to rotate downward. As the mobile part cell rotates downward, it is propelled away from the inner support base until reaching a point at which it moves increasingly inward toward the inner support base and eventually collides with the inner support base.

The collision of the mobile part cell with the inner support base mechanically jars the mobile part cell, causing wire parts contained therein to vibrate and tumble. Such mechanical agitation separates and reorients wire parts, and maintains wire parts in a sufficiently mobile state during the coating process to prevent wire parts from sticking or becoming coated together. Mechanical agitation also insures that surfaces of individual wire parts will be sufficiently exposed to circulating parylene vapors during the coating process to produce even and consistent surface coats.

In another embodiment of the invention, the mobile part cell is removably attached by at least one pair of cables to an inner surface of the inner support base. The mobile part cell is propelled away from the inner support base as the inner support base rotates. The mobile part cell rotates upward in a circular arc, as described in the first embodiment, until reaching just past a top or uppermost point of the circular arc, wherein the mobile part cell begins to rotate downward. As the mobile part cell rotates downward, it is propelled away from the inner support base until reaching a point at which it moves increasingly inward toward the inner support base and collides with the inner support base. Collision of the mobile part cell with the inner support base creates the mechanical agitation necessary to maintain the wire parts contained within the mobile part cell in a sufficiently mobile state during the coating process to prevent the wire parts from sticking or becoming coated together.

In still another embodiment of the invention, the mobile part cell is contained within at least one carrier cell that has a larger overall dimension than the mobile part cell and is rigidly attached to the inner surface of the inner support base. The mobile part cell is not fixed or attached to the carrier cell, but, rather, is freely contained within the carrier cell. As the inner support base rotates, the carrier cell rotates from a fixed position on the inner support base, and the mobile part cell contained therein rolls and tumbles about the carrier cell.

As the mobile part cell rolls and tumbles about the carrier cell, it is mechanically agitated by at least one pair of cleats. The pair of cleats includes a first cleat mounted on the outer surface of the inner support base and a second cleat coupled to a surface of an inner wall of the coating chamber. The first cleat rotates from a fixed position on the inner support base and momentarily engages or rests upon the second cleat when the first cleat meets the second cleat. The first cleat immediately disengages or slips from the second cleat as the first cleat continues to rotate from rotation of the inner support base. The disengagement or slipping of the first cleat from the second cleat mechanically jars the carrier cell and the mobile part cell contained therein such that wire parts contained within the mobile part cell are maintained in a sufficiently mobile state and prevented from sticking or becoming coated together.

The inner support base may include an end plate that is attached at the first terminal end and the second terminal end of the hollow chamber to enclosed the carrier cell and the mobile part cell contained therein.

In yet another embodiment of the invention, the mobile part cell is contained within a carrier cell having at least one cell cleat rigidly attached to an inner wall surface of the carrier cell. As the carrier cell rotates from a fixed position on the inner support base, the mobile part cell engages or rests upon the cell cleat. As the carrier cell rotates, the mobile part cell is lifted upward by the cell cleat. When the carrier cell begins to rotate downward, the mobile part cell disengages or falls from the cell cleat and collides against the inner wall surface of the carrier cell. The collision of the mobile part cell with the carrier cell mechanically jars the mobile part cell which maintains wire parts contained therein in a sufficiently mobile state during the coating process.

Similarly, the first and the second terminal ends of the hollow chamber of the inner support base may be sealed with end plates to enclose the carrier cell and mobile part cell contained within the hollow chamber.

The mobile cellular tumble coater may be scaled upward by attaching a plurality of mobile part cells to the inner support base during a single coating run, to achieve a high parts per load ratio. The mobile cellular tumble coater may coat large quantities or bulk loads of wire parts by increasing the diameter of the inner support base and the size of the coating chamber to accommodate a plurality of mobile part cells or larger-sized mobile part cells. Mobile part cells may contain wire parts of a variety of lengths and diameters during a single run, thereby increasing the economy of the mobile cellular tumble coater. In addition, individual mobile part cells may be divided into subcompartments for containing a variety of sizes of wire parts further increasing the economy of the mobile cellular tumble coater.

BRIEF DESCRIPTION OF THE DRAWINGS

For a better understanding of the present invention, reference is made to the drawings which are incorporated herein by reference and in which.

DETAILED DESCRIPTION OF THE INVENTION

Illustrative embodiments of the present invention described below are directed to a mobile cellular tumble coater for use in coating wire-type articles and wire parts with parylene by vapor deposition. Those skilled in the art will appreciate, however, that embodiments of the present invention are not limited to coating wire-type articles and wire parts with parylene, but rather, may be used in other applications utilizing other polymers or materials suitable for coating wire-type articles and wire parts by vapor deposition. In addition, those skilled in the art will recognize that the present invention may be used to coat other types of articles and workpieces which may require tumbling or some form of mechanical agitation to achieve consistent and even surface films or surface coatings.

Embodiments of the present invention will be described with reference to FIGS. 1–6 which are presented for the purpose of illustrating embodiments and are not intended to limit the scope of the claims.

Figure 1:
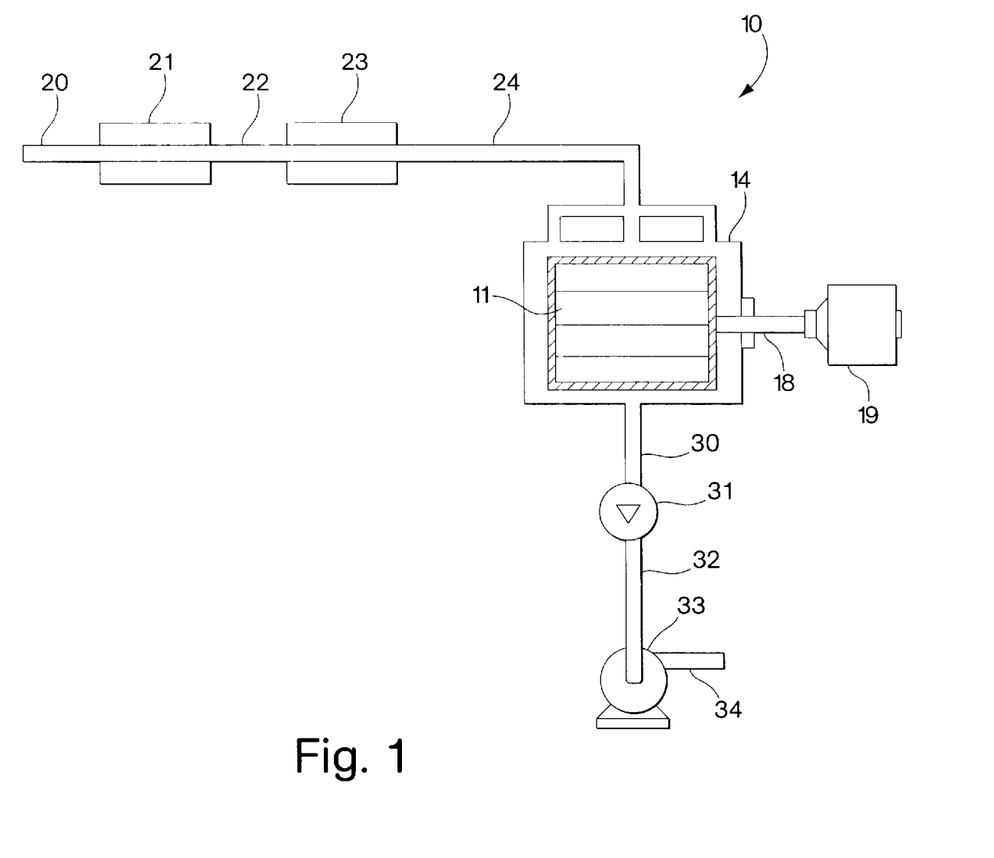
FIG. 1 illustrates a schematic diagram of a prior art vapor deposition coating apparatus.

As shown in FIG. 1, the present invention provides a mobile cellular tumble coater 11 for coating articles, and, in particular, for coating wire-type articles and wire parts (hereinafter referred to as "wire parts") with parylene by a vapor deposition process conducted within a coating apparatus 10. The mobile cellular tumble coater 11 is positioned within a coating chamber 14 of the coating apparatus in which vaporized parylene circulates under vacuum conditions to coat wire parts by vapor deposition.

Although parylene is more stable as a dimer, it must be pyrolized to a monomer vapor prior to circulating in the coating chamber. The process of pyrolizing parylene to monomer vapors is disclosed in U.S. Pat. No. 5,201,956, which is assigned to the assignee of the present invention and incorporated herein by reference.

Parylene dimer is introduced to a vaporization zone 21 of the coating apparatus 10 by means 20, as shown in FIG. 1. The vaporization zone 21 is heated by a heater with a capacity of heating the vaporization zone 21 to temperatures up to 200° C. or greater to vaporize parylene under pressures typically used during the deposition process. Vaporized parylene is then passed from the vaporization zone 21 by means 22 to a pyrolysis zone 23. The pyrolysis zone 23 includes a heater with a capacity of heating the pyrolysis zone 23 to temperatures up to 800° C. or greater under pressures typically used during the deposition process. The vaporized parylene is pyrolitically cleaved to reactive parylene monomer vapors. Monomer parylene vapors are subsequently passed from the pyrolysis zone 23 by means 24 to the coating chamber 14 in which the mobile cellular tumble coater 11 is positioned.

The coating process is conducted under vacuum conditions wherein the mobile cellular tumble coater 11 is in communication with a vacuum created in the coating chamber 14, enabling parylene monomer vapors to readily flow through the mobile cellular tumble coater. Such vacuum conditions are created by means of a vacuum pump 33, as shown in FIG. 1, which provides subatmospheric pressure in the coating chamber 14 from about 10 to 50 millitorrs. The vacuum pump 33 is connected by means 32 to a cryogenic condensation trap 31 and a suction line 30. The vacuum pump 33 draws residual vapors of parylene monomer through the suction line 30 and into the condensation trap 31 in which they are condensed, isolated and finally withdrawn from the coating apparatus by means 34.

During the coating process, reactive monomer parylene vapors circulate throughout the coating chamber 14 and readily flow through the mobile cellular tumble coater 11. As monomer parylene vapors diffuse throughout the atmosphere of the mobile cellular tumble coater, they condense and polymerize on the surfaces of wire parts upon contact with the surfaces to form parylene surface coats. The mobile cellular tumble coater tumbles wire parts contained therein during the coating process to maintain wire parts in a sufficiently mobile state to prevent them from sticking or becoming coated together.

Figure 2:
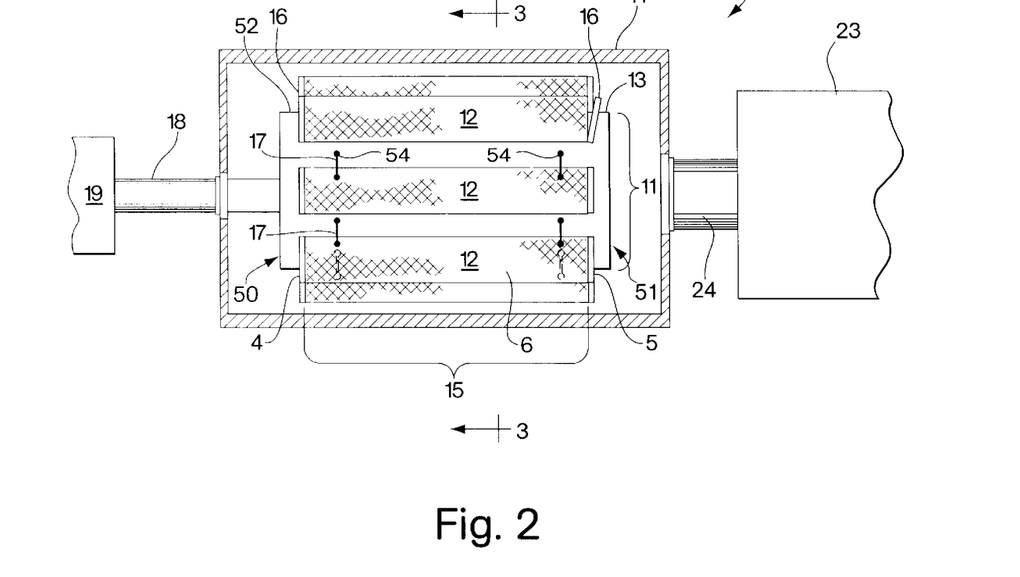
FIG. 2 illustrates a side view of a mobile cellular tumble coater contained within a coating apparatus with mobile part cells removably attached to an outer surface of an inner support base.
Figure 3:
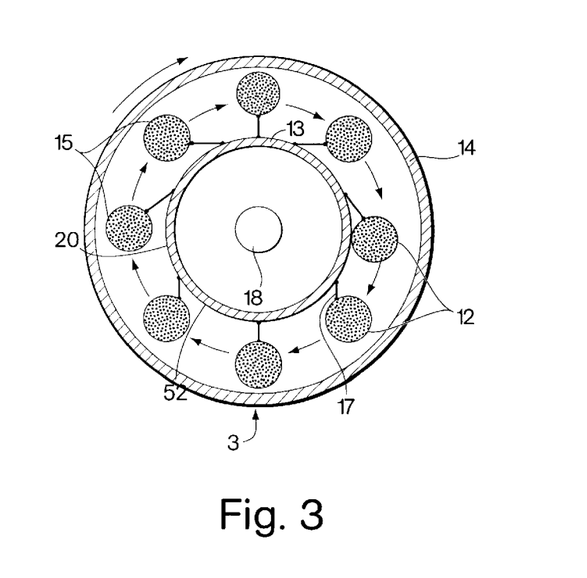
FIG. 3 illustrates a cross-sectional view of the mobile cellular tumble coater taken along line 3—3 of FIG. 2.

In a first embodiment of the invention illustrated in FIGS. 2 and 3, the mobile cellular tumble coater 11 includes at least one mobile part cell 12 attached to an inner support base 13, which is positioned within the coating chamber 14 of the coating apparatus 10. The mobile part cell 12 includes a hollow portion 15 with a first terminal end 4 and a second terminal end 5 and an outer wall 6 which connects each terminal end. The cross-sectional geometry of the hollow portion 15 of the mobile part cell is not critical to the invention. FIG. 3 illustrates a cross-section of a circular cylindrical hollow portion 15.

The hollow portion 15 of the mobile part cell 12 may be constructed of metal screening or any suitable material which has the properties to withstand conditions of the vapor deposition coating process, such as, but not limited to, wire mesh, high-density polyethylene, polyvinylchloride, polyurethane or nylon. The hollow portion 15 shown in FIGS. 2 and 3 is constructed of metal screening with a gauge large enough to permit parylene vapors to readily flow through the mobile part cell 12, yet small enough to avoid creating pressure gradients within the mobile part cell that inhibit adequate and even circulation of parylene vapors. Pressure gradients cause uneven and incomplete deposition of parylene vapors on the surfaces of wire parts which results in incomplete and uneven surface coats. The gauge of the screening material used to construct the hollow portion may be altered to accommodate the size of wire parts to be coated.

The inner support base 13 of the mobile cellular tumble coater 11 includes a hollow chamber 20 with a first open terminal end 50 and a second open second terminal end 51 opposing the first terminal end 50 and an outer wall 52 connecting each terminal end. As shown in FIGS. 2 and 3, the hollow chamber may be constructed as a circular cylinder similar to the geometry of the mobile part cell 12. The hollow chamber 20 may be constructed of solid or porous material which has the properties to withstand conditions of the vapor deposition coating process. Alternatively, the outer wall 52 of the hollow chamber 20 may include multiple throughholes that are large enough to permit the flow of coating vapors through the hollow chamber 20. Such throughholes enhance the circulation of parylene vapors throughout the mobile cellular tumble coater 11 and the coating chamber 14.

As shown in FIGS. 2 and 3, the inner support base 13 is positioned within the coating chamber 14 in a substantially horizontal orientation. The inner support base 13 rotates by a drive shaft 18 that is rigidly connected at one end to the inner support base 13. The opposing end of the drive shaft 18 extends from the inner support base 13 through the coating chamber 14 and a vacuum seal to rigidly connect to a drive motor 19. The drive motor 19 turns the drive shaft 18 which rotates the inner support base 13.

The mobile part cell 12 may be loaded with wire parts by various convenient devices. FIG. 2 shows the mobile part cell with an end cap 16 removably attached to at least one of the first and the second terminal ends 4, 5 of the hollow portion 15. The end cap 16 may be constructed for complete removal from the mobile part cell or may be attached to the mobile part cell by hinges. The end cap is constructed of any suitable material which has the properties to withstand conditions of the vapor deposition coating process, such as, but not limited to, high-density polyethylene, polyvinylchloride, polyurethane or nylon.

The mobile part cell 12 is attached to the inner support base 13 in a manner which permits the mobile part cell to be easily detached and reattached to the inner support base. In the first embodiment shown in FIGS. 2 and 3, the mobile part cell is removably attached to an outer surface of the inner support base 13 by at least two attachment devices, such as, but not limited to, a pair of cables 17. Each cable 17 is connected at a first terminal end to the mobile part cell 12 adjacent to the first terminal end 4 or the second terminal end 5 of the mobile part cell. A second terminal end of the cable attaches the mobile part cell to the outer surface of the inner support base. Each cable attaches the mobile part cell to the outer surface of the inner support base in such a manner that the mobile part cell swings away or is propelled from the inner support base at the point of attachment of the cable to the inner support base. For example, each cable may be attached to the outer surface of the inner support base by a loop or hook-like connection 54 which is constructed and arranged to allow the cable to move or swing from the point of its attachment to the inner support base.

Other attachment devices for attaching the mobile part cell 12 to the inner support base 13 may include, but are not limited to, hinges, wires and rods. The attachment devices are constructed of rigid, inflexible material which has the properties to withstand conditions of the vapor deposition coating process, such as, but not limited to, metal or plastic.

The rigid and inflexible nature of the attachment devices enables the mobile part cell 12 to rotate from a fixed position about the inner support base 13 as the inner support base rotates. As shown in FIG. 3, the cables 17 enable the mobile part cell 12 to swing or be propelled away from the inner support base 13 during rotation. The loop or hook-line connection 54 which attaches each cable to the inner support base facilitates such movement or swinging of the mobile part cell. For example, as the inner support base rotates in a clockwise direction, the mobile part cell similarly rotates about the inner support base in a clockwise direction, while being swung or propelled away from the inner support base by the rigid cables. Without a rigid and inflexible nature, the cables would buckle and collapse under the weight of the mobile part cell and cause the mobile part cell to roll and slide on the inner support base in a relaxed position, rather than swing or be propelled from the inner support base.

As shown in FIG. 3, the rotation of the inner support base 13 causes the mobile part cell 12 to rotate from a fixed position on the inner support base. As the inner support base rotates, the mobile part cell swings and is propelled away for the inner support base. The mobile part cell rotates upward in a circular arc until reaching just past a top or uppermost point of the circular arc, wherein the mobile part cell begins to rotate downward. As the mobile part cell rotates downward, it is propelled away from the inner support base until reaching a point at which its moves increasingly inward toward the inner support base and eventually collides against the inner support base. The collision of the mobile part cell with the inner support base agitates the mobile part cell and causes wire parts contained therein to vibrate and tumble about the mobile part cell.

The collision-produced mechanical jarring separates and reorients wire parts and maintains wire parts in a sufficiently mobile state during the coating process to prevent wire parts from sticking or becoming coated together, as parylene vapors condense and polymerize on wire part surfaces. The mechanical agitation also maximizes the exposure of the surfaces of wire parts to circulating parylene vapors, thereby assuring that the surface of each wire part is sufficiently exposed to and receive an adequate deposition of parylene vapors to form consistent parylene surface films. The mobile part cell typically rotates about the inner support base up to about 6 revolutions per minute, which enables wire parts to remain tumbled and separated throughout the coating run.

Figure 4:
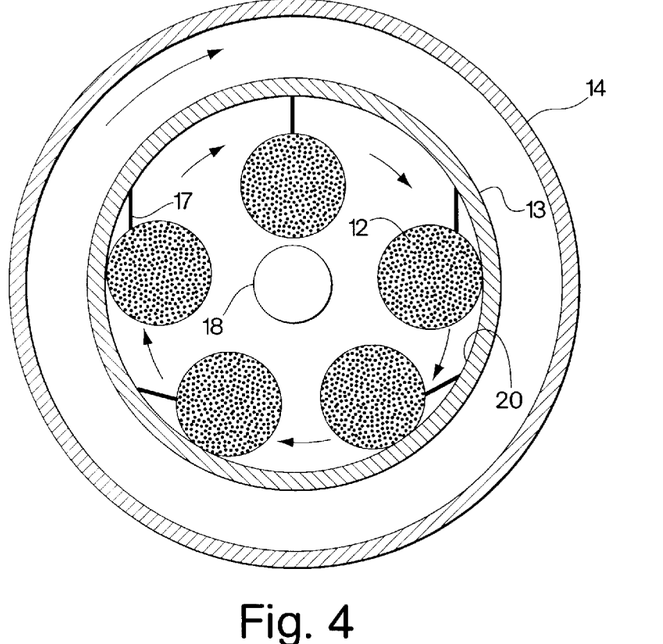
FIG. 4 illustrates a cross-sectional view of the mobile cellular tumble coater with the mobile part cell removably attached to an inner surface of the inner support base.

In another embodiment of the invention illustrated in FIG. 4, the mobile part cell 12 is removably attached by at least one pair of rigid, inflexible cables 17 to an inner surface of the hollow chamber 20 of the inner support base 13. Each cable 17 is similarly attached to the inner surface of the hollow chamber 20 by a loop or hook-like connection which enables the mobile part cell to move or swing from the inner support base at the point of attachment of the cable to the inner support base. The mobile part cell similarly rotates from a fixed position on the inner support base as the inner support base rotates. The mobile part cell is propelled away from the inner support base and rotates upward in a circular arc motion until reaching just past a top or uppermost point of the circular arc, wherein the mobile part cell begins to rotate downward. As the mobile part cell rotates downward, it is propelled away from the inner support base until it reaches a point at which it moves increasingly inward toward the inner support base and eventually collides against the inner surface of the inner support base. The collision of the mobile part cell with the inner support base mechanically jars the mobile part cell and causes wire parts contained therein to vibrate and tumble, thereby maintaining wire parts in a sufficiently mobile state to prevent wire parts from sticking or becoming coated together.

Figure 5:
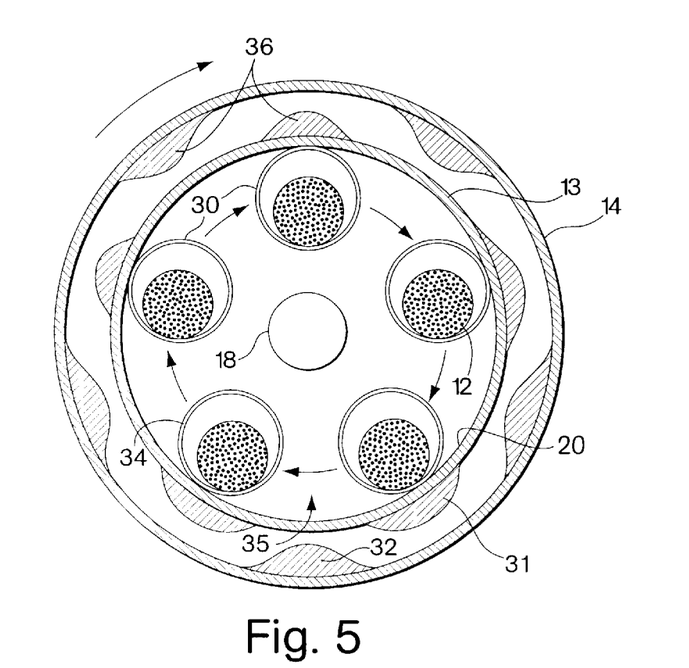
FIG. 5 illustrates a cross-sectional view of the mobile cellular tumble coater with the mobile part cell contained within a carrier cell rigidly attached to the inner surface of the inner support base and including a pair of cleats.

In still another embodiment of the invention illustrated in FIG. 5, the mobile part cell 12 is contained within a carrier cell 30 which is rigidly attached to the inner surface of the inner support base 13. The mobile part cell 12 is not attached to the carrier cell 30, but, rather, is freely contained in the carrier cell. The mobile part cell rolls and tumbles about the carrier cell 30 as the carrier cell rotates from a fixed position on the inner support base 13 during rotation of the inner support base rotates.

The carrier cell 30 has a larger overall dimension than the mobile part cell 12, and is configured and constructed similar to the mobile part cell. The carrier cell includes a hollow portion 34 having a first terminal end and a second terminal end (not shown) with an outer wall connecting the terminal ends (not shown). The hollow portion 34 may be of a circular cylindrical shape similar to the geometry of the mobile part cell 12. In addition, the hollow portion includes at least one end cap removably attached to at least the first or the second terminal end of the carrier cell 30 similar to the end cap 16 of the mobile part cell. The end cap of the carrier cell may be constructed for complete removal from the carrier cell or may be attached to the carrier cell by hinges. The end cap of the hollow portion 34 may be similarly constructed of suitable materials, such as, but not limited to high-density polyethylene, polyvinylchloride, polyurethane and nylon.

The outer wall of the hollow portion 34 includes multiple throughholes large enough to permit vapors to readily flow into the carrier cell and into the mobile part cell contained therein, while small enough to prevent pressure gradients within the carrier cell and the mobile part cell which inhibit adequate circulation of parylene vapors. The hollow portion 34 may be similarly constructed of metal screening or suitable materials which have the properties to withstand conditions of the vapor deposition coating process, such as, but not limited to, wire mesh, high-density polyethylene, polyvinylchloride, polyurethane and nylon.

As shown in FIG. 5, the inner support base 13 may include an end plate 35 attached to the first terminal end 4 and the second terminal end 5 of the inner support base 13 to enclose the carrier cell 30 and the mobile part cell 12 contained therein.

As the inner support base 13 rotates, the mobile part cell 12 contained within the carrier cell 30 rolls and tumbles about the carrier cell 30 as the carrier cell rotates from a fixed position on the inner support base. Wire parts contained in the mobile part cell are maintained in a sufficiently mobile state during rotation of the inner support base by mechanical agitation created by at least one pair of cleats 36. The pair of cleats 36 include a first cleat 31 mounted to the outer surface of the inner support base 13 and a second cleat 32 coupled to a surface of an inner wall of the coating chamber 14. The first cleat 31 rotates from a fixed position on the inner support base as the inner support base rotates until the first cleat 31 engages the second cleat 32. The first cleat 31 momentarily engages or rests upon the second cleat 32 when the first cleat and the second cleat meet during rotation of the inner support base. The first cleat immediately disengages or slips from the second cleat 32 as the first cleat 31 continues to rotate by rotation of the inner support base. The disengagement or slipping of the first cleat 31 from the second cleat 32 mechanically jars the carrier cell and causes the mobile part cell contained therein to roll and tumble. The mechanical agitation caused by the rolling and tumbling of the mobile part cells maintains wire parts contained therein in a sufficiently mobile state throughout the coating process to prevent wire parts from sticking or becoming coated together.

Figure 6:
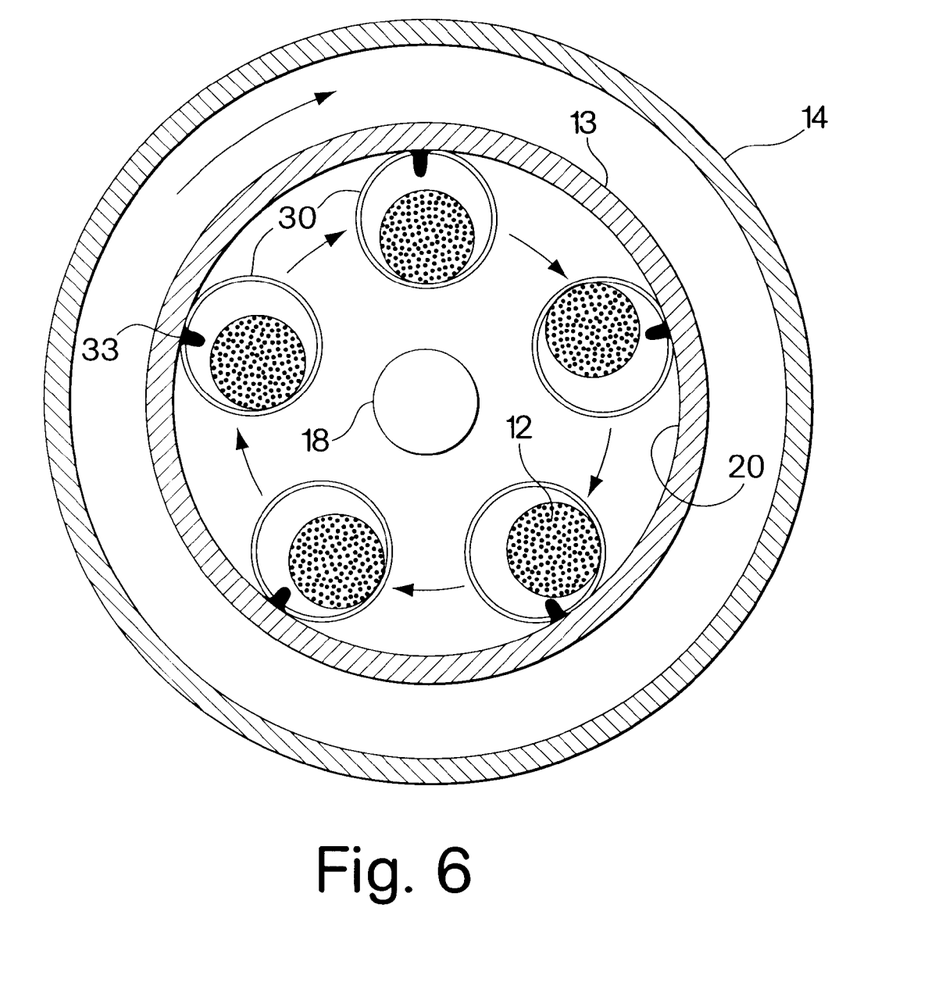
FIG. 6 illustrates a cross-sectional view of the mobile cellular tumble coater with the mobile part cell contained within the carrier cell having a cell cleat rigidly attached to an inner wall of the carrier cell.

In yet another embodiment of the invention illustrated in FIG. 6, the pair of cleats are replaced by at least one cell cleat 33 rigidly attached to a surface of an inner wall of the carrier cell 30. As the inner support base 13 rotates, the mobile part cell 12 rolls and tumbles about the carrier cell and engages the cell cleat 33. As the mobile part cell 12 and the cell cleat 33 engaged, the mobile part cell is lifted upward by the rotation of the cell cleat. As rotation continues, the carrier cell begins to rotate downward and the mobile part cell disengages or slips from the cell cleat in response to the downward rotation. The mobile part cell falls from the cell cleat and collides with the inner wall of the carrier cell, which mechanically agitates the mobile part cell and wire parts contained therein. Such mechanical agitation maintains wire parts in a sufficiently mobile state during the coating process.

As shown in FIG. 6, the inner support base 13 may similarly include an end plate 37 attached to the first terminal end 4 and the second terminal end 5 of the inner support base 13 to enclose the carrier cell 30 and the mobile part cell 12 contained therein.

A plurality of mobile part cells may be attached to the inner support base to increase the load capacity for a single coating run. Employing several mobile part cells enables large quantities or bulk loads of wire parts to be simultaneously coated, thereby achieving a high parts per load ratio. The load capacity of the mobile cellular tumble coater may be scaled upward with an increase in diameter of the inner support base and the coating chamber to accommodate additional mobile part cells.

The mobile cellular tumble coater can produce, for instance, up to approximately 5,000 to 6,000 pieces per load in the same coating chamber during a single coating run, while a static prior art coating apparatus and method achieves a lower parts per load ratio of approximately 500 to 1,000 pieces. The mobile cellular tumble coater further increases the economy of coating wires parts by vapor deposition in that the individual mobile part cells may hold different sizes of wire parts enabling parts of various lengths, ranging from a few inches long to several feet long, and various diameters, ranging from a few thousandths to .100 inches, to be coated during a single coating run. In addition, individual mobile part cells may be subdivided to create subcompartments for simultaneously holding different sizes of wire parts.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A method of coating articles with a coating material by a vapor deposition coating process conducted under vacuum conditions in a coating chamber of a coating apparatus, comprising steps of:

loading articles into at least one part cell removably disposed to an inner support base, the part cell having a first terminal end and a second terminal end and an outer wall connecting each terminal end, the outer wall having multiple throughholes large enough to permit vapors of coating material to flow into the part cell and small enough to contain the articles therein, and disposed on the inner support base in such a manner which permits the part cell to move or swing from the inner base support;

sealing the part cell with at least one end cap removably connected to at least one of the first and the second terminal ends;

producing a pressure vacuum within the coating chamber;

rotating the inner support base, wherein the part cell rotates from a fixed position on the inner support base;

delivering vapors of coating material under pressure to the coating chamber;

circulating coating material vapors throughout the coating chamber;

mechanically agitating the part cell by colliding the part cell with the inner support base; and removing articles from the part cell after the coating process is complete.

* * * * *